United States Patent
Chun

(10) Patent No.: US 8,163,446 B2
(45) Date of Patent: Apr. 24, 2012

(54) METHOD FOR MANUFACTURING PHOTOMASK USING SELF-ASSEMBLED MOLECULE LAYER

(75) Inventor: Jun Chun, Chungcheongbuk-do (KR)

(73) Assignee: Hynix Semiconductor Inc., Icheon-si (KR)

( * ) Notice: Subject to any disclaimer, the term of this patent is extended or adjusted under 35 U.S.C. 154(b) by 214 days.

(21) Appl. No.: 12/648,030

(22) Filed: Dec. 28, 2009

(65) Prior Publication Data

US 2010/0233589 A1    Sep. 16, 2010

(30) Foreign Application Priority Data

Mar. 10, 2009    (KR) .................. 10-2009-0020233

(51) Int. Cl.
*G03F 1/00*    (2012.01)
*G01L 21/30*    (2006.01)
(52) U.S. Cl. .............................. 430/5; 216/61
(58) Field of Classification Search ........ 430/5; 216/61; 438/780
See application file for complete search history.

(56) References Cited

U.S. PATENT DOCUMENTS

| | | | |
|---|---|---|---|
| 6,420,702 B1 * | 7/2002 | Tripsas et al. ............... | 250/310 |
| 6,507,474 B1 * | 1/2003 | Singh et al. .................. | 361/230 |
| 2002/0102473 A1 | 8/2002 | Tange et al. | |
| 2003/0129505 A1 | 7/2003 | Shiraishi et al. | |
| 2004/0203256 A1 * | 10/2004 | Yang et al. .................. | 438/780 |
| 2006/0046205 A1 * | 3/2006 | Hah et al. .................... | 430/324 |

FOREIGN PATENT DOCUMENTS

| | | |
|---|---|---|
| KR | 10-2007-0067875 | 6/2007 |
| KR | 10-2008-0021956 | 3/2008 |
| KR | 10-2008-0099915 | 11/2008 |

* cited by examiner

*Primary Examiner* — Stephen Rosasco

(74) *Attorney, Agent, or Firm* — Marshall, Gerstein & Borun LLP

(57) ABSTRACT

A method for fabricating a photomask using a self-assembled molecule layer, comprising: forming, on a transparent substrate, a stacked structure of a phase shift pattern and a light shielding pattern over the phase shift pattern, the stacked structure exposing a portion of a surface of the transparent substrate; exposing the phase shift pattern and a portion of the surface of the transparent substrate by removing a portion of the light shielding pattern; forming a self-assembled molecule layer allowing movement of electrons on the exposed surface of the transparent substrate; measuring a critical dimension of the phase shift pattern formed with the self-assembled molecule layer; neutralizing electrons applied during the measurement of the critical dimension with the self-assembled molecule layer allowing movement of electrons; and removing the self-assembled molecule layer.

8 Claims, 4 Drawing Sheets

METHOD FOR MANUFACTURING PHOTOMASK USING SELF-ASSEMBLED MOLECULE LAYER

CROSS-REFERENCE TO RELATED APPLICATION

Priority to Korean patent application number 10-2009-0020233 filed on Mar. 10, 2009, the entire disclosure of which is incorporated by reference, is claimed.

BACKGROUND OF THE INVENTION

The invention relates generally to a photomask and, more particularly, to a method for fabricating a photomask using a self-assembled molecule layer.

A photomask functions to form a desired pattern on a wafer while light is irradiated on a mask pattern formed on a substrate and selectively transmitted light is transferred onto the wafer. As the photomask, a binary mask made by forming a light shielding pattern containing chromium (Cr) on a transparent substrate and having a light transmitting region for transmitting light therethrough and a light shielding region for shielding the light is generally used. However, as the degree of integration of semiconductor devices increases and thus pattern sizes are reduced, it has become difficult to precisely form a desired pattern due to diffraction or interference of light transmitted through the binary mask. To overcome the difficulty in precisely forming the pattern, a phase shift mask using a phase shift material having a transmittance of several percent has been developed and used.

In the phase shift mask, a mask pattern to be transferred onto a wafer is formed by forming a phase shift layer and a light shielding layer on a transparent substrate and implementing two patterning processes including writing and pattern transfer steps. A first patterning process is implemented to form the mask pattern to be transferred onto the wafer, primarily to a light shielding layer. The light shielding pattern formed in the first patterning process functions as a mask for etching to form a phase shift pattern thereunder. A second patterning process is implemented to selectively remove the light shielding pattern. By removing the light shielding pattern on the circuit pattern with the second patterning process, an intended phase shift pattern is exposed.

Next, the pattern is transferred onto the wafer using the photomask, and a critical dimension of the pattern formed on the wafer is measured to determine whether it is within tolerance, to thereby determine whether the photomask must be re-fabricated. Meanwhile, the critical dimension of the pattern is measured using a scanning electron microscope (SEM) of a type designed for critical pattern measurement. The scanning electron microscope measures the critical dimension by supplying electrons onto a pattern extracted as a sample and detecting reflected secondary electrons.

However, when measuring the critical dimension with the scanning electron microscope, there is a problem that charges accumulate on the transparent substrate, which is a non-conductor, and thus an image defect is generated. It is difficult to treat such a scanning electron microscope for conductivity with, e.g., platinum (Pt). To improve the problem of charge accumulation, a method of grounding to a surface of the light shielding layer of the photomask is employed. However, as the pattern of the photomask becomes finer, neutralization of the charges accumulated on the transparent substrate becomes more difficult. When the charges induced, resolution is lowered or a deviated landing is caused upon the measurement with the scanning electron microscope, resulting in a measuring error. Accordingly, there is a problem that it becomes difficult to measure the precise critical dimension.

SUMMARY OF THE INVENTION

In one embodiment, a method for fabricating a photomask using a self-assembled molecule layer comprises: forming on a transparent substrate a stacked structure of a phase shift pattern and a light shielding pattern over the phase shift pattern, the stacked structure exposing a portion of a surface of the transparent substrate; exposing the phase shift pattern and a portion of the surface of the transparent substrate by removing a portion of the light shielding pattern; forming a self-assembled molecule layer that allows movement of electrons on the exposed surface of the transparent substrate; measuring a critical dimension of the phase shift pattern formed with the self-assembled molecule layer; neutralizing electrons applied during the measurement of the critical dimension with the self-assembled molecule layer; and removing the self-assembled molecule layer.

Preferably, the self-assembled molecule layer is formed by dipping the transparent substrate formed with the phase shift pattern in a solution of self-assembling molecules.

Preferably, the transparent substrate formed with the phase shift pattern is dipped in the solution of self-assembling molecules for at most 10 minutes, and the self-assembled molecule layer preferably is formed to a thickness of 3 Å to 4 Å.

Preferably, the solution of self-assembling molecules is a solution in which individual self-assembling molecules having, at both ends thereof, functional groups each connected with amine group ($NH_3^+$) with excellent electrical conductivity are dissolved in deionized water. The self-assembling molecule connected with the amine group ($NH_3^+$) preferably comprises 1,12-diaminododecaneadihydrochloride.

Preferably, the self-assembling molecules are dissolved in the deionized water with a concentration of at most 1 mmol.

Preferably, the critical dimension is measured with a scanning electron microscope for critical dimension measurement that measures the critical dimension by injecting electrons onto the transparent substrate and detecting secondary electrons reflected from the pattern formed on the transparent substrate.

Preferably, the self-assembled molecule layer is removed by cleaning by applying an ultrasonic wave while supplying deionized water.

DESCRIPTION OF SPECIFIC EMBODIMENTS

A method for fabricating a photomask in accordance with the invention is described in detail below with reference to the accompanying drawings.

FIGS. 1 through 8 illustrate a process for fabricating a photomask using a self-assembled molecular layer in accordance with an embodiment of the invention.

Figure 1:
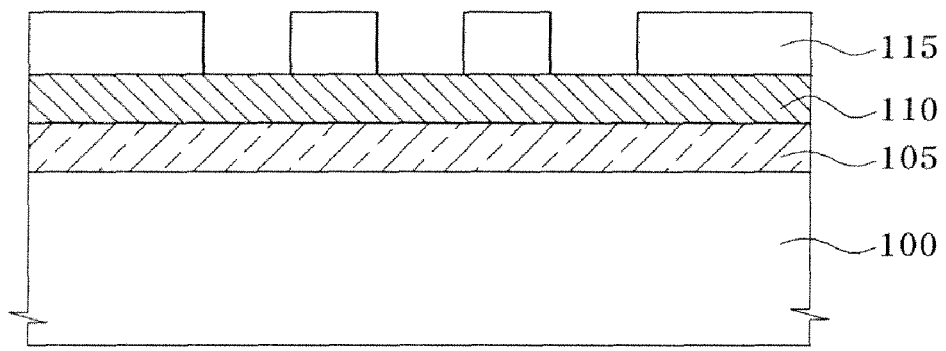
FIGS. 1 through 8 illustrate a process for fabricating a photomask using a self-assembled molecular molecule layer in accordance with an embodiment of the invention.

Referring to FIG. 1, a phase shift layer 105 is formed on a transparent substrate 100. The transparent substrate 100 preferably contains quartz and preferably is made of a transparent material allowing transmission of light. The transparent substrate 100 preferably is made of a silicon oxide (SiO$_x$)-based material and thus can easily induce an absorption reaction with a self-assembled molecular layer to be formed subsequently. The phase shift layer 105 formed on the transparent substrate 100 preferably comprises a molybdenum (Mo)-containing compound, highly preferably molybdenum silicon nitride (MoSiN).

Next, a light shielding layer 110 is deposited on the phase shift layer 105. The light shielding layer 110 formed on the phase shift layer 105 shields the light transmitted through the transparent substrate 100 in a subsequent exposure process. This light shielding layer 110 preferably comprises chromium (Cr). Next, a resist pattern 115 that selectively exposes a portion of a surface of the light shielding layer 110 is formed. The resist pattern 115 preferably is formed by coating a resist layer (not shown) on the light shielding layer 110 and implementing a lithography process including an exposure process and a development process on the resist layer.

Figure 2:
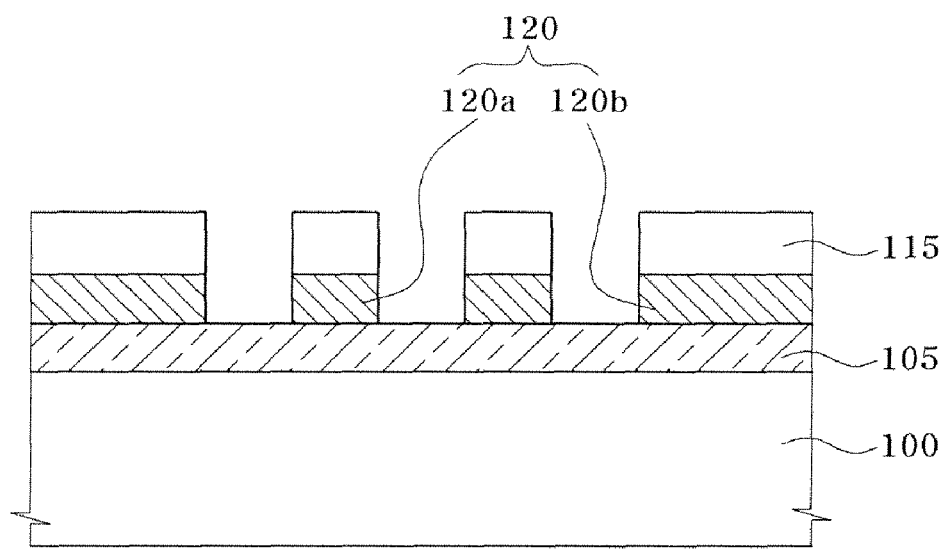

Referring to FIG. 2, a first patterning process that forms a light shielding pattern 120 by etching the exposed portion of the light shielding layer (110, see FIG. 1) using the resist pattern 115 is implemented. Herein, the light shielding pattern 120 includes a light shielding layer main pattern 120a disposed in a main cell region and a light shielding layer frame pattern 120b disposed in a frame region. At this time, a portion of a surface of the phase shift layer 105 thereunder is selectively exposed by the light shielding pattern 120. Next, the resist pattern 115 is removed by a strip process.

Figure 3:
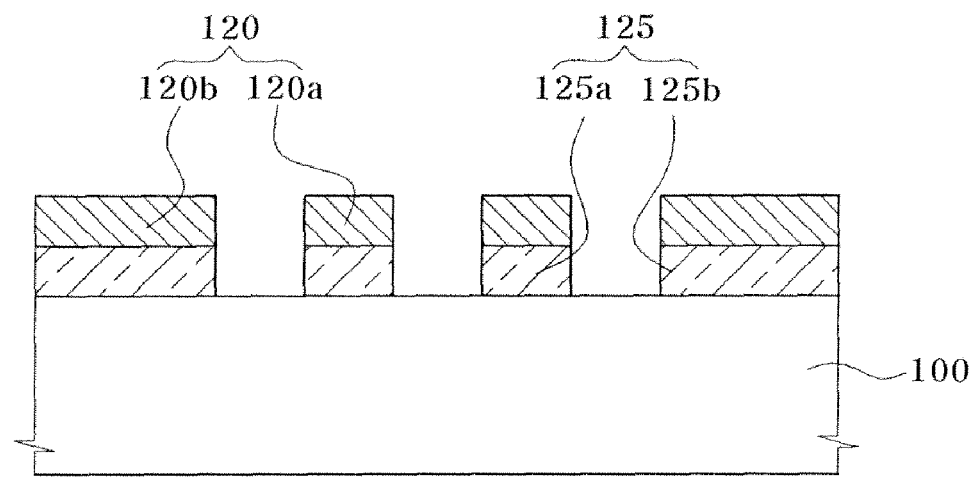

Referring to FIG. 3, the phase shift layer (105, see FIG. 2) is etched using the light shielding pattern 120 as an etch mask to form a phase shift pattern 125. The phase shift pattern 125 includes a phase shift layer main pattern 125a disposed in the main cell region and a phase shift layer frame pattern 125b disposed in the frame region. By this phase shift pattern 125a, 125b formed as such, a portion of a surface of the transparent substrate 100 is selectively exposed.

Figure 4:
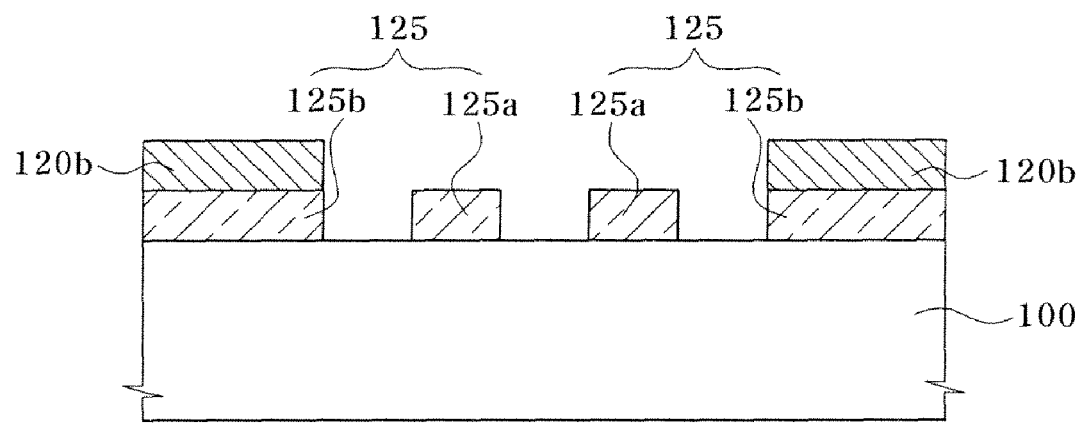

Referring to FIG. 4, a second patterning process that selectively removes the light shielding layer main pattern 120a disposed in the main region is implemented. Herein, the light shielding layer frame pattern 120b disposed in the frame region is not removed. The phase shift layer main pattern 125a is exposed by selectively removing the light shielding layer main pattern 120a with the second patterning process. At this time, the phase shift layer frame pattern 125b is covered with the light shielding layer frame pattern 120b.

Figure 5:
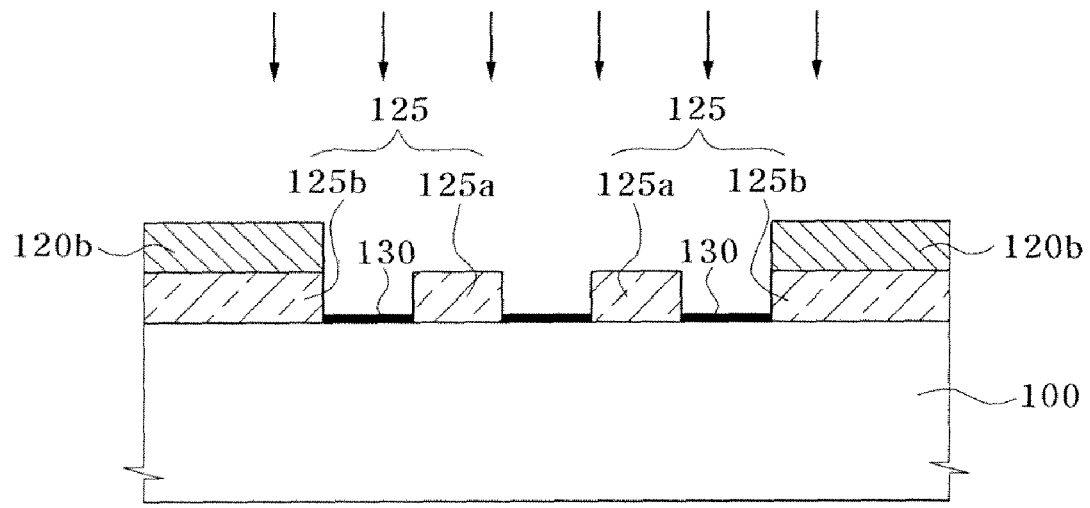
Figure 6:
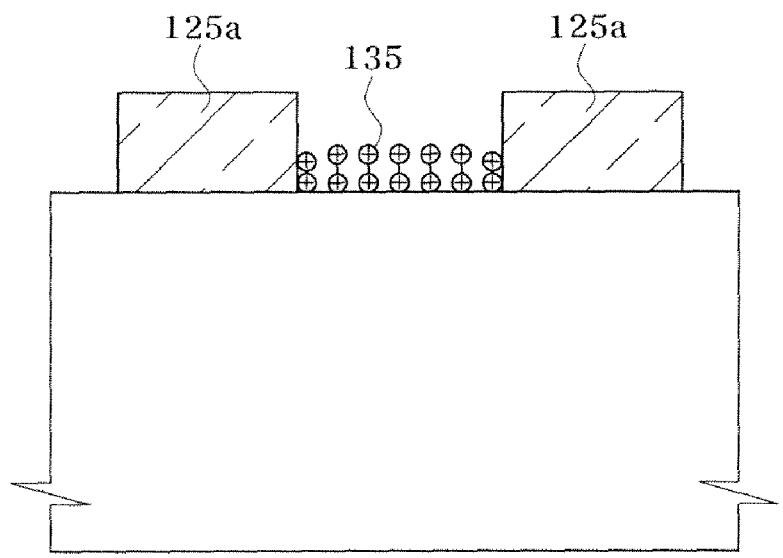

Referring to FIGS. 5 and 6, a self-assembled molecule layer 130 is formed on the exposed surface of the transparent substrate 100. To form the self-assembled molecule layer 130, the transparent substrate 100 formed with the phase shift pattern 125 preferably is dipped into a solution of self-assembling molecules. The solution of self-assembling molecules preferably is a solution in which individual self-assembling molecules having, at both ends thereof, functional groups each connected with an amine group (NH$_3^+$) with excellent electrical conductivity are dissolved in deionized water. Herein, the self-assembling molecules preferably are dissolved in the solution of self-assembling molecules preferably with a concentration of at most 1 mmol, e.g. a concentration of 0.5 mmol to 1 mmol. This self-assembling molecule preferably has, in functional groups at both ends thereof, 1,12-diaminododecaneadihydrochloride connected with an aniline hydrochloride group (NH$_3^+$Cl$^-$), of which chemical formula is as follows:

[Chemical formula 1]

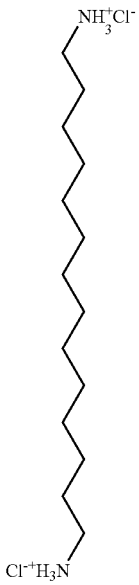

The self-assembling molecules preferably having, at both ends thereof, functional groups each connected with amine group (NH$_3^+$) induce the surface of the mask to have electrical conductivity, and selectively react with a silicon oxide (SiO$_x$)-based material. Accordingly, the self-assembling molecules connected with amine group (NH$_3^+$) are adsorbed well onto the exposed surface of the transparent substrate 100, which preferably is made of a silicon oxide (SiO$_x$)-based material.

When the transparent substrate 100 formed with the phase shift pattern 125 remains dipped in the solution of self-assembling molecules, the functional groups of the self-assembling molecules within the solution of self-assembling molecules are adsorbed onto the exposed surface of the transparent substrate 100 to form a layer as illustrated in FIG. 6, and as a result, the self-assembled molecule layer 130 is formed as illustrated in FIG. 5. The self-assembled molecule layer 130 preferably is formed by dipping the transparent substrate 100 formed with the phase shift pattern 125 in the solution of self-assembling solution for at most 10 minutes, e.g. for 5 minutes to 10 minutes, and preferably is formed to a thickness of 3 Å to 4 Å, as shown at 135 in FIG. 6. In the illustrated exemplary embodiment, the amine groups (NH$_3^+$) in the self-assembled molecule layer 130 are bound by ionic bonds. Next, the transparent substrate 100 is removed from the solution of self-assembling molecules, followed by rinsing with deionized water, and drying. Then, the exposed surface of the transparent substrate 100, an electrical non-conductor, is formed with a self-assembled molecule layer 130, which is an ion monolayer allowing movement of electrons.

Figure 7:
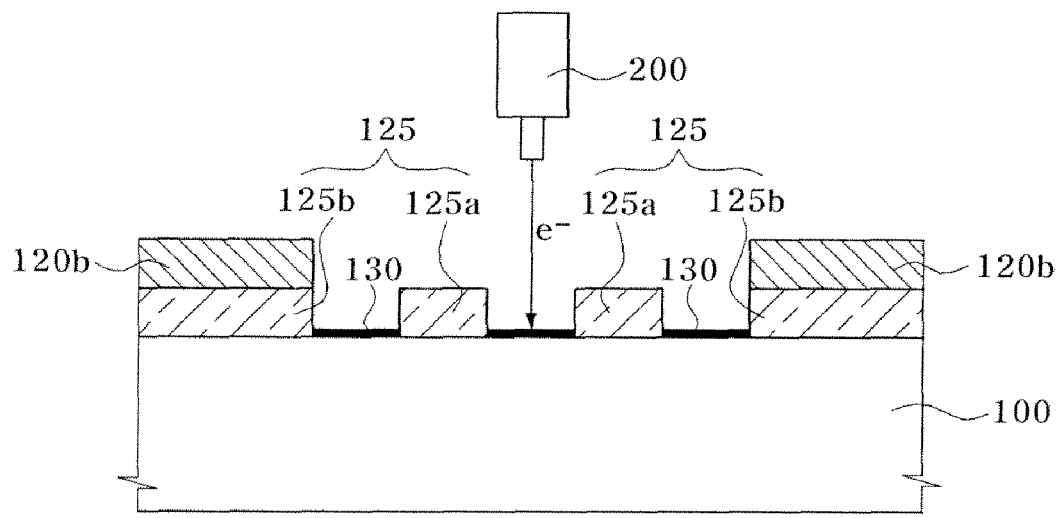
Figure 8:
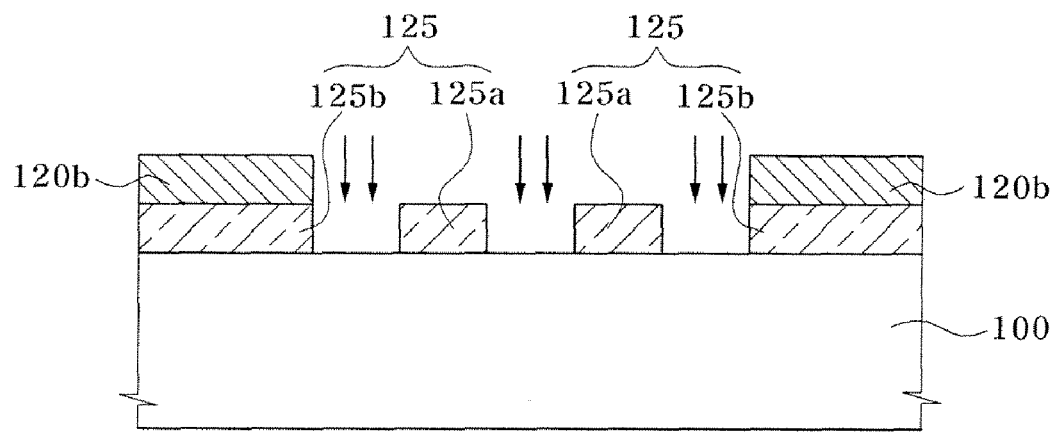

Referring to FIGS. 7 and 8, a critical dimension of the phase shift layer main pattern 125a formed on the transparent substrate 100 is measured with a scanning electron microscope 200 for critical dimension measurement. To this end, the scanning electron microscope 200 is placed on the transparent substrate 100 and measures the critical dimension by injecting electrons (e$^-$) and detecting secondary electrons reflected from the pattern formed on the transparent substrate 100. When measuring the critical dimension using the scanning electron microscope 200 with the surface of the transparent substrate 100, an electrical non-conductor, being exposed, there is a problem that charges are accumulated on the transparent substrate 100 and an image defect is generated. When the image defect is generated, there is a problem that it is difficult to measure the precise critical dimension of the pattern and reliability of the measurement is thus lowered.

However, when forming the self-assembled molecule layer 130, which is an ion monolayer allowing electron movement, on the exposed surface of the transparent substrate 100 and measuring the critical dimension as described herein, it is possible to prevent accumulation of negative charges (e−) on the transparent substrate 100 by the characteristic of the ion providing the electrons. Accordingly, it is possible to prevent accumulation of charges on the transparent substrate 100 and enhance a resolution during the measurement of the critical dimension using the scanning electron microscope 200.

Referring to FIG. 8, a cleaning process is implemented on the transparent substrate 100 subject to the measurement of the critical dimension with the scanning electron microscope 200 to remove the self-assembled molecule layer 130 deposited on the exposed surface of the transparent substrate 100. The self-assembled molecule layer 130 can be removed in such a cleaning process by applying an ultrasonic wave while supplying deionized water. Herein, the self-assembled molecule layer 130, since it is coupled to the surface of the transparent substrate 100 not by a covalent bond but by an ionic bond, can be easily removed even by a conventional cleaning manner including an ultrasonic cleaning. Accordingly, it is possible to prevent defect generation in the mask due to a complex cleaning manner.

In a method for fabricating a photomask using a self-assembled molecule layer in accordance with the invention, a self-assembled molecule layer allowing electron movement is formed on the transparent substrate of quartz material to give electrical conductivity to the electrically non-conductive surface of the transparent substrate. Accordingly, since the movement of electrons is enabled during the measurement of the critical dimension, it is possible to prevent accumulation of negative charges on the transparent substrate. Further, since the self-assembled molecule layer is coupled to the surface of the transparent substrate by an ionic bond, the self-assembled molecule layer can be easily removed even by a conventional cleaning manner and it is possible to prevent generation of a defect in the mask.

While the invention has been described with respect to the specific embodiments, various changes and modifications may be made without departing from the spirit and scope of the invention as defined in the following claims.

What is claimed is:

1. A method for fabricating a photomask using a self-assembled molecule layer, comprising:
    forming on a non-conductor transparent substrate a stacked structure of a phase shift pattern and a light shielding pattern over the phase shift pattern, the stacked structure exposing a portion of a surface of the non-conductor transparent substrate;
    exposing the phase shift pattern and said portion of the surface of the non-conductor transparent substrate by removing a portion of the light shielding pattern;
    forming a self-assembled molecule layer on the exposed surface of the non-conductor transparent substrate except the phase shift pattern and the light shielding pattern wherein the self-assembled molecule layer allows movement of electrons;
    measuring a critical dimension of the phase shift pattern by injecting electrons, wherein the self-assembled molecule layer prevents accumulation of the injected electrons on the non-conductor transparent substrate by movement of electrons; and
    removing the self-assembled molecule layer to expose the surface of the transparent substrate.

2. The method of claim 1, comprising forming the self-assembled molecule layer by dipping the non-conductor transparent substrate formed with the phase shift pattern in a solution of self-assembling molecules.

3. The method of claim 2, comprising dipping the non-conductor transparent substrate formed with the phase shift pattern in the solution of self-assembling molecules for 5 minutes to 10 minutes to form the self-assembled molecule layer to a thickness of 3 Å to 4 Å.

4. The method of claim 2, wherein the solution of self-assembling molecules is a solution of self-assembling molecules having, at both ends thereof, functional groups each connected to an amine group ($NH_3^+$) with excellent electrical conductivity dissolved in deionized water.

5. The method of claim 4, wherein the self-assembling molecules connected with the amine group ($NH_3^+$) comprise 1,12-diaminododecaneadihydrochloride.

6. The method of claim 4, wherein the self-assembling molecules are dissolved in the deionized water at a concentration of 0.5 mmol to 1 mmol.

7. The method of claim 1, comprising measuring the critical dimension with a scanning electron microscope for critical dimension measurement that measures the critical dimension by injecting electrons onto the non-conductor transparent substrate and detecting secondary electrons reflected from a pattern formed on the non-conductor transparent substrate.

8. The method of claim 1, comprising removing the self-assembled molecule layer by cleaning by applying an ultrasonic wave while supplying deionized water.

* * * * *